(12) United States Patent
Klipp et al.

(10) Patent No.: US 9,275,851 B2
(45) Date of Patent: Mar. 1, 2016

(54) AQUEOUS, NITROGEN-FREE CLEANING COMPOSITION AND ITS USE FOR REMOVING RESIDUES AND CONTAMINANTS FROM SEMICONDUCTOR SUBSTRATES SUITABLE FOR MANUFACTURING MICROELECTRONIC DEVICES

(75) Inventors: Andreas Klipp, Lambsheim (DE); Vijay Immanuel Raman, Mannheim (DE); Shyam Sundar Venkataraman, Zhongli (TW); Raimund Mellies, Salzbergen (DE); Mingjie Zhong, Potsdam, NY (US)

(73) Assignee: BASF SE, Ludwigshafen (DE)

(*) Notice: Subject to any disclaimer, the term of this patent is extended or adjusted under 35 U.S.C. 154(b) by 73 days.

(21) Appl. No.: 14/006,617

(22) PCT Filed: Feb. 28, 2012

(86) PCT No.: PCT/IB2012/050912
§ 371 (c)(1),
(2), (4) Date: Sep. 20, 2013

(87) PCT Pub. No.: WO2012/127336
PCT Pub. Date: Sep. 27, 2012

(65) Prior Publication Data
US 2014/0011359 A1  Jan. 9, 2014

Related U.S. Application Data

(60) Provisional application No. 61/454,593, filed on Mar. 21, 2011.

(51) Int. Cl.
| | | |
|---|---|---|
| *C11D 1/72* | (2006.01) | |
| *C11D 1/722* | (2006.01) | |
| *C11D 3/20* | (2006.01) | |
| *H01L 21/02* | (2006.01) | |
| *C11D 3/37* | (2006.01) | |
| *C11D 1/66* | (2006.01) | |
| *C11D 3/00* | (2006.01) | |
| *C11D 1/825* | (2006.01) | |
| *C11D 11/00* | (2006.01) | |
| *G03F 7/42* | (2006.01) | |

(52) U.S. Cl.
CPC .......... *H01L 21/02074* (2013.01); *C11D 1/662* (2013.01); *C11D 1/72* (2013.01); *C11D 1/721* (2013.01); *C11D 1/722* (2013.01); *C11D 1/825* (2013.01); *C11D 3/0073* (2013.01); *C11D 3/2041* (2013.01); *C11D 3/2065* (2013.01); *C11D 3/2082* (2013.01); *C11D 3/3757* (2013.01); *C11D 11/0047* (2013.01); *G03F 7/422* (2013.01); *G03F 7/426* (2013.01)

(58) Field of Classification Search
CPC .......... C11D 1/72; C11D 1/721; C11D 1/722; C11D 1/662; C11D 3/2082; C11D 3/3757; C11D 3/2041; C11D 3/2065; C11D 3/0073; B08B 3/04
USPC .......... 510/175, 176, 245, 255, 258, 421, 477, 510/488, 505, 506; 134/1.2, 1.3
See application file for complete search history.

(56) References Cited

U.S. PATENT DOCUMENTS

| | | | |
|---|---|---|---|
| 6,019,855 A | 2/2000 | Finch et al. | |
| 7,129,199 B2* | 10/2006 | Zhang et al. | 510/175 |
| 7,250,391 B2 | 7/2007 | Kanno et al. | |
| 8,173,585 B2* | 5/2012 | Cobb et al. | 510/191 |
| 2002/0106589 A1* | 8/2002 | Rodney et al. | 430/325 |
| 2003/0036570 A1 | 2/2003 | Abe | |
| 2004/0161933 A1 | 8/2004 | Takashima et al. | |
| 2004/0186037 A1* | 9/2004 | Cheung et al. | 510/426 |
| 2005/0014667 A1 | 1/2005 | Aoyama et al. | |
| 2005/0020463 A1* | 1/2005 | Ikemoto et al. | 510/175 |
| 2005/0176259 A1 | 8/2005 | Yokoi et al. | |
| 2005/0266683 A1 | 12/2005 | Lee | |
| 2007/0099810 A1* | 5/2007 | Matsunaga et al. | 510/302 |
| 2007/0155646 A1* | 7/2007 | Becker et al. | 510/499 |
| 2008/0076688 A1 | 3/2008 | Barnes et al. | |
| 2008/0173328 A1* | 7/2008 | Nishiwaki | 134/6 |
| 2008/0280452 A1 | 11/2008 | Yokoi et al. | |
| 2009/0239777 A1 | 9/2009 | Angst et al. | |
| 2009/0291873 A1 | 11/2009 | Tamboli | |
| 2010/0163788 A1 | 7/2010 | Visintin et al. | |
| 2010/0167972 A1 | 7/2010 | Kawase et al. | |

(Continued)

FOREIGN PATENT DOCUMENTS

| | | |
|---|---|---|
| EP | 1 189 265 A1 | 3/2002 |
| EP | 1 306 415 | 5/2003 |

(Continued)

OTHER PUBLICATIONS

U.S. Appl. No. 14/356,530, filed May 6, 2014, Seyffer, et al.
International Search Report Issued Jul. 12, 2012 in PCT/IB12/050912 Filed Feb. 28, 2012.

*Primary Examiner* — Gregory R Delcotto
(74) *Attorney, Agent, or Firm* — Oblon, McClelland, Maier & Neustadt, L.L.P.

(57) ABSTRACT

Aqueous, nitrogen-free cleaning composition, preparation and use thereof are provided. The composition having a pH of from 5 to 8 comprises (A) an amphiphilic nonionic, water-soluble or water-dispersible surfactant and (B) a metal chelating agent selected from polycarboxylic acids having at least 3 carboxylic acid groups. The composition is used for removing residues and contaminants from semiconductor substrates.

14 Claims, No Drawings

(56) References Cited

U.S. PATENT DOCUMENTS

| | | |
|---|---|---|
| 2010/0248494 A1 | 9/2010 | Barr et al. |
| 2010/0273330 A1* | 10/2010 | Farkas et al. .................. 438/692 |
| 2010/0286014 A1 | 11/2010 | Barnes et al. |
| 2010/0304313 A1* | 12/2010 | Zhang et al. .................. 430/432 |
| 2011/0098210 A1* | 4/2011 | Dreilinger et al. ............ 510/419 |
| 2011/0237480 A1* | 9/2011 | Mizutani et al. ............... 510/175 |

FOREIGN PATENT DOCUMENTS

| | | |
|---|---|---|
| EP | 2 209 134 A2 | 7/2010 |
| WO | 2004 063301 | 7/2004 |
| WO | 2006 127885 | 11/2006 |

* cited by examiner

AQUEOUS, NITROGEN-FREE CLEANING COMPOSITION AND ITS USE FOR REMOVING RESIDUES AND CONTAMINANTS FROM SEMICONDUCTOR SUBSTRATES SUITABLE FOR MANUFACTURING MICROELECTRONIC DEVICES

FIELD OF THE INVENTION

The present invention relates to an aqueous, nitrogen-free cleaning composition.

Moreover, the present invention relates to the use of the aqueous, nitrogen-free cleaning composition for removing residues and contaminants from the surface of semiconductor substrates useful for manufacturing microelectronic devices.

In particular, the present invention relates to the use of the aqueous, nitrogen-free cleaning composition for removing residues and contaminants from the surface of semiconductor substrates comprising electrically conductive layers, electrically insulating dielectric layers and barrier layers after chemical mechanical polishing (CMP).

CITED DOCUMENTS

The documents cited in the present application are incorporated by reference in their entirety.

BACKGROUND OF THE INVENTION

As semiconductor device geometries continue to shrink, more emphasis has to be placed on improved, interconnect structures to minimize resistance-capacitance (RC) delays. Strategies to minimize interconnect delays include improving the conductivity of the interconnect metal and lowering the dielectric constant k value of the insulating dielectric layers. For example, copper has emerged as a replacement for conventional aluminum as the interconnect metal in advanced devices down to the 20 nm or even lower node. Copper is more conductive than aluminum (thus reducing resistance-capacitance time delays) and is also less subject to electromigration when compared to conventional aluminum metallization.

In the manufacture of deep submicron semiconductor devices comprising large-scale (LSI), very-large-scale (VLSI) or ultra-large-scale (ULSI) integration, the copper damascene process is used to form conductive copper lines and vias in the low-k or ultra-low-k dielectric layer. One important step of the damascene process is the chemical mechanical polishing (CMP) of copper for the removal of excess copper above the dielectric layer surface. Customarily, barrier layers containing or consisting of tantalum, tantalum nitride, titanium nitride or ruthenium are located between the copper metal and the dielectric layer materials in order to prevent the diffusion of copper into the dielectric material.

The CMP process itself involves holding and rotating a thin, flat substrate of the semiconductor device against a wetted polishing pad under controlled pressure and temperature in the presence of CMP slurries. The CMP slurries contain abrasive materials and various chemical additives as appropriate to the specific CMP process and requirements. Following the CMP process, contaminants and residues consisting of particles from the CMP slurries, added chemicals, and reaction byproducts are left behind on the polished substrate surface. In addition, the polishing of a substrate surface having copper/low-k or ultra-low-k dielectric materials often generates carbon-rich particles that settle onto the surface after CMP.

However, all residues and contaminants must be removed prior to any further steps in the microelectronic device fabrication process to avoid degradation of the device reliability and introduction of defects into the microelectronic devices.

Various alkaline and acidic chemistries have been proposed in the past for the removal of such residues and contaminants from the surface of the polished semiconductor substrates.

Thus, the international patent application WO 2006/127885 A1 or the American application US 2008/0076688 A1 both disclose an aqueous alkaline cleaning composition for post-CMP cleaning comprising at least one amine, at least one passivating agent such as benzotriazole (BTA), optionally at least one quaternary ammonium hydroxide such as TMAH and optionally at least one reducing agent. It is believed that the passivating agent forms a layer consisting of a passivating-copper complex on top of the copper/copper (I) oxide surface such that solid particles can be easily removed by the cleaning composition. This strategy is also termed "displacement cleaning".

The American patent application US 2009/0239777 A1 discloses an aqueous alkaline post-CMP cleaning composition comprising at least one corrosion inhibitor and at least one amine wherein the corrosion inhibitor is selected from the group inter alia consisting of glucuronic acid, squaric acid, ascorbic acid, flavonols, and anthocyanins. The composition may contain reducing agents such as gallic acid, polyols such as diols and triols, amphiphilic nonionic surfactants such as polyethylene glycols, polypropylene glycols, polyethylene or polypropylene glycol ethers or dinonylphenyl polyoxyethylene, dispersing agents such as acrylic acid-containing polymers, and complexing agents such as formic acid, acetic acid, propionic acid, acetone, 2,4-pentanedione, acrylic acid, adipic acid, fumaric acid acid, gluconic acid, glucuronic acid, glyoxylic acid, maleic acid, malic acid, malonic acid, mandelic acid, phenylacetic acid, phthalic acid, isophthalic acid, terephthalic acid, pyromellitic acid, succinic acid, pyrocatechol, trimellitic acid, trimesic acid, tartaric acid, citric acid, sorbitol and xylitol.

The alkaline amine-containing post-CMP cleaning compositions exhibit various disadvantages. Thus, smell and release amine vapors into the fab which can poison the photoresists.

Therefore, aqueous, acidic post-CMP cleaning compositions have been developed, as for example, the composition disclosed in the American patent application US 2010/0286014 A1 which comprises at least one surfactant, at least one dispersing agent, and at least one sulfonic acid-containing hydrocarbon. Suitable surfactants are amphiphilic nonionic surfactants such as polyethylene glycols, polypropylene glycols, polyethylene or polypropylene glycol ethers or dinonylphenyl polyoxyethylene. Suitable dispersing agents are acrylic acid-containing polymers. Optionally, complexing agents such as formic acid, acetic acid, propionic acid, acetone, 2,4-pentanedione, acrylic acid, adipic acid, fumaric acid and itaconic acid, gluconic acid, glucuronic acid, glyoxylic acid, maleic acid, malic acid, malonic acid, mandelic acid, phenylacetic acid, phthalic acid, isophthalic acid, terephthalic acid, pyromellitic acid, succinic acid, pyrocatechol, pyrogallol, trimellitic acid, trimesic acid, tartaric acid, citric acid, sorbitol and xylitol can be used.

Moreover, the American patent application US2009/291873 A1 discloses an aqueous post-CMP cleaning composition having a pH in the range of from 2 to 11 obligatorily comprising a compound containing an amino acid group and/or a betain group. The composition optionally contains a pH modifier chosen from an organic acid and/or an organic base, a surfactant and a chelating agent. Amphiphilic nonionic surfactants such as polyalkylene oxide surfactants can also be used. Suitable amphiphilc nonionic surfactants include octyl and nonyl phenol ethoxylates such as Triton™ X-114, X-102, X-45 and X-15 and ethoxylated alcohols such as BRIJ™ 56 ($C_{16}H_{33}(OCH_2CH_2)_{100}OH$) or BRIJ™ 58 ($C_{16}H_{33}(OCH_2CH_2)_{20}OH$), alkyloxylated acetylenic diol surfactants, glucosides, polyethylene glycols and polyethylene-polypropylene glycols. Additionally, corrosion inhibitors may also be added. Suitable corrosion inhibitors are anthranilic acid, gallic acid, benzoic acid, isophthalic acid, fumaric acid, phthalic acid, maleic anhydride, phthalic anhydride, fructose, lactic acid, dihydroxy benzene and trihydroxy benzene.

However, both, the alkaline and the acidic post-CMP cleaning compositions have their drawbacks. Thus, they increase the surface roughness of the polished copper surfaces due to redox reactions which cause etching, corrosion and pitting. The etching components of the compositions can chemically undercut the particles on top of the polished surfaces thus creating additional defects such as voids. The surfactants used in the prior art compositions are frequently not able to remove the abrasive particles efficiently. This necessitates strong etchants for undercutting the abrasive particles. However, such strong etchants can increase corrosion. The presence of barrier metals such as tantalum, tantalum nitride, titanium nitride or ruthenium can lead to an increased galvanic corrosion. Therefore, the strong acidic or alkaline process conditions require strong copper inhibitors such as BTA in order to avoid copper damage by high local or global static etch rates. However, strong copper inhibitors such as BTA are water-insoluble hydrophobic compounds and, therefore, are easily absorbed by the polished copper surfaces to form a passivation film which requires solvents such as amines for its removal. Last but not least, the cleaning compositions are capable of attacking the low-k and ultra-low-k dielectric materials surrounding the copper wirings and vias.

OBJECTS OF THE INVENTION

It is the object of the present invention to provide a novel aqueous cleaning composition which does not exhibit the drawbacks of the prior art aqueous alkaline and acidic post-CMP cleaning compositions.

Thus, the novel aqueous cleaning composition should no longer increase the surface roughness of the polished copper surfaces due to redox reactions which cause etching, corrosion and pitting. The novel composition should no longer chemically undercut the particles on top of the polished surfaces thus creating additional defects such as voids.

The surfactants used in the novel composition should be particularly able to remove the abrasive particles efficiently so that strong etchants for undercutting the abrasive particles should be no longer necessary. This way, an undesired increase of corrosion should be avoided. The novel composition should also have a low surface tension so that organic solvents are no longer needed for removing the residues and contaminants. The novel composition should also exhibit low foaming so that additional anti-foaming agents can be avoided.

In the presence of barrier metals such as tantalum, tantalum nitride, titanium nitride or ruthenium, the aqueous cleaning composition should no longer cause or increase galvanic corrosion.

The novel aqueous cleaning composition should no longer contain strong, hydrophobic, nitrogen-containing copper inhibitors which are easily absorbed by the polished copper surfaces to form a passivation film. This way, the use of strong copper inhibitors and, therefore, the use of strong etchants leading to copper damage by high local or global static etch rates and the use of organic solvents such as amines for removing the passivation film (which use is accompanied by environmental and safety concerns) should be avoided.

Last but not least, the novel aqueous cleaning composition should no longer erode the low-k and ultra-low-k dielectric materials surrounding the copper wirings and vias and/or change their dielectric constant k.

Consequently, the novel aqueous cleaning composition should be particularly suitable for removing residues and contaminants from the surface of semiconductor substrates useful for manufacturing microelectronic devices.

SUMMARY OF THE INVENTION

Accordingly, the novel aqueous, nitrogen-free cleaning composition having a pH in the range of from 5 to 8 has been found, the said cleaning composition comprising
(A) at least one surfactant selected from the group consisting of
  (A1) amphiphilic nonionic, water-soluble or water-dispersible surfactants having
    (a11) at least one hydrophobic group selected from the group consisting of branched alkyl groups having 5 to 20 carbon atoms; and
    (a12) at least one hydrophilic group consisting of oxyethylene monomer units;
  (A2) amphiphilic nonionic, water-soluble or water-dispersible surfactants having
    (a21) at least one hydrophobic group selected from the group consisting of branched alkyl groups having 5 to 20 carbon atoms; and
    (a22) at least one hydrophilic group selected from the group consisting of polyoxyalkylene groups comprising
      (a221) oxyethylene monomer units and
      (b222) at least one type of substituted oxyalkylene monomer units wherein the substituents are selected from the group consisting of alkyl, cycloalkyl, aryl, alkyl-cycloalkyl, alkyl-aryl, cycloalkyl-aryl and alkyl-cycloalkyl-aryl groups;
    the said polyoxyalkylene group of (a22) containing the monomer units (a221) and (a222) in random, alternating, gradient and/or blocklike distribution; and
  (A3) amphiphilic nonionic, water-soluble or water-dispersible alkyl polyglucoside surfactants;
(B) at least one water-soluble or water-dispersible metal chelating agent selected from the group consisting of polycarboxylic acids having at least 3 carboxylic acid groups.

Hereinafter, the novel aqueous, nitrogen-free cleaning composition is referred to as the "composition of the invention".

Moreover, the novel use of the composition of the invention for removing residues and contaminants from the surface of semiconductor substrates useful for manufacturing microelectronic devices has been found, which novel use is hereinafter referred to as the "use of the invention".

Additionally, the novel method for manufacturing microelectronic devices from semiconductor substrates has been found, the said method comprising the step of removing residues and contaminants from the surface of the semiconductor substrates by contacting them at least once with the composition of the invention.

Hereinafter, the novel method for manufacturing microelectronic devices is referred to as the "method of the invention".

Advantages of the Invention

In view of the prior art, it was surprising and could not be expected by the skilled artisan that the objects of the invention could be solved by the composition, the use and the method of the invention.

It was in particular surprising that the composition, the use and the method of the invention no longer exhibited the drawbacks of the prior art aqueous alkaline and acidic post-CMP cleaning compositions and the prior art methods for removing contaminants and residues including metal oxides such as copper oxide from the surface of semiconductor substrates suitable for manufacturing semiconductor devices It was even more surprising that the composition of the invention no longer increased the surface roughness of polished copper surfaces due to redox reactions which cause etching, corrosion and pitting. The composition of the invention did no longer chemically undercut the particles on top of the polished surfaces thus creating additional defects such as voids. The surfactants used in the composition of the invention were particularly able to remove the abrasive particles efficiently so that strong etchants for undercutting the abrasive particles were no longer necessary. This way, an undesired increase of corrosion could be avoided. The composition of the invention also had a low surface tension so that organic solvents were no longer needed for removing the residues and contaminants. The composition of the invention also exhibited low foaming so that additional anti-foaming agents could be avoided.

In the presence of barrier metals such as tantalum, tantalum nitride, titanium nitride or ruthenium, the composition of the invention no longer caused or increased galvanic corrosion.

The composition of the invention no longer contained strong, hydrophobic, nitrogen-containing copper inhibitors which are easily absorbed by the polished copper surfaces to form a passivation film. This way, the use of strong copper inhibitors and, therefore, the use of strong etchants leading to copper damage by high local or global static etch rates and the use of organic solvents such as amines for removing the passivation film could be avoided. In particular, the environmental and safety concerns accompanying the use of organic solvents could be entirely avoided.

Last but not least, the novel aqueous cleaning composition no longer eroded the low-k and ultra-low-k dielectric materials surrounding the copper wirings and vias or changed their dielectric constant k.

Therefore, the composition of the invention was excellently suited for the use of the invention.

Moreover, the method of the invention yielded microelectronic devices having integrated circuits (ICs) with LSI, VLSI and ULSI of exceptionally high reliability and long lifetime in excellent yields.

DETAILED DESCRIPTION OF THE INVENTION

The composition of the invention is an aqueous composition. This means that it contains water, in particular, deionized water, preferably, ultra-pure water as the main solvent and dispersing agent. Nevertheless, the composition of the invention may contain at least one water-miscible organic solvent, however, only in such minor amounts that they do not change the aqueous nature of the composition of the invention. Most preferably, the composition of the invention is entirely free from organic solvents.

Preferably, the composition of the invention contains water in amounts of from 16 to 99.99% by weight, more preferably 70 to 99.9% by weight, even more preferably 80 to 99.9% by weight and, most preferably, 90 to 99.9% by weight, the weight percentages being based on the complete weight of the composition of the invention.

In the context of the present invention, the feature "free from" means that a relevant element and/or a relevant compound cannot be detected in the composition of the invention with known state-of-the-art analytical methods for qualitatively and/or quantitatively detecting the element or the compounds. Gas chromatography and/or mass spectrometry can be mentioned as such analytical methods.

In this sense, the composition of the invention is free from nitrogen, in particular, free from nitrogen contained in, for example, amine, amide, imide, hydrazine, hydroxyl amine, urethane, triazole, tetrazole groups and similar nitrogen-containing functional groups as well as cationic groups derived from such nitrogen-containing functional groups.

The composition of the invention has a pH in the range of from 5 to 8, preferably, 5.5 to 7.5 and most preferably, 6 to 7. The pH may be adjusted by way of nitrogen-free bases such as lithium hydroxide, sodium hydroxide, potassium hydroxide, rubidium hydroxide, cesium hydroxide, magnesium hydroxide, calcium hydroxide, strontium hydroxide and barium hydroxide and nitrogen-free buffering systems based on phosphates, borates and salts of organic carboxylic acids such as phthalic acid.

In the context of the present invention, the feature "water-soluble" means that the relevant component or ingredient of the composition of the invention can be dissolved in the aqueous phase on the molecular level.

The feature "water-dispersible" means that the relevant component or ingredient of the composition of the invention can be dispersed in the aqueous phase to form a stable emulsion or suspension.

The first essential ingredient of the composition of the invention is at least one, preferably, one surfactant (A), which is selected from the group of water-soluble or water-dispersible, preferably, water-soluble, amphiphilic nonionic surfactants (A1), (A2) and (A3).

The amphiphilic nonionic surfactant (A1) comprises at least one hydrophobic group (a11). This means that the amphiphilic nonionic surfactant (A1) can have more than one hydrophobic group (a11), e.g., 2, 3 or more groups (a11), which are separated from each other by at least one hydrophilic group (a12) hereinbelow described.

The hydrophobic group (a11) is selected from the group consisting of branched alkyl groups having 5 to 20, preferably 7 to 16 and, most preferably, 8 to 15 carbon atoms.

Preferably, the branched alkyl groups (a11) have on the average a degree of branching of from 1 to 5, preferably 1 to 4 and, most preferably, 1 to 3.

Suitable branched alkyl groups (a11) are derived from isopentane, neopentane and the branched hexane, heptane, octane, nonane, decane, undecane, dodecane, tridecane, tetradecane, pentadecane, hexadecane, heptadecane, nonadecane and eicosane isomers.

Most preferably, the branched alkyl groups (a11) are derived from Guerbet-alcohols having 8 to 15, preferably, 10 carbon atoms (cf. Römpp Online 2011, "Guerbet-Reaktion").

The amphiphilic nonionic surfactant (A1) comprises at least one hydrophilic group (a12). This means that the amphiphilic nonionic surfactant (A1) contains more than one group (a12), e.g., 2, 3 or more groups (a12), which are separated from each other by hydrophobic groups (a11).

The hydrophilic groups (a12) consist of oxyethylene monomer units. The degree of polymerization of the hydrophilic groups (a12) can vary broadly and, therefore, can be adapted most advantageously to the particular requirements of a given composition, use and method of the invention. Preferably, the degree of ethoxylation is in the range of from 4 to 20, more preferably 6 to 16 and, most preferably, 7 to 8.

The amphiphilic nonionic surfactant (A1) can have different blocklike general structures. Examples of such general blocklike structures are:
a11-a12,
a11-a12-a11,
a12-a11-a12,
a12-a11-a12-a11,
a11-a12-a11-a12-a11, and
a12-a11-a12-a11-a12.

Most preferably, the blocklike general structure a11-a12 is used.

Preferably, the average molecular weight of the amphiphilic nonionic surfactant (A1) is in the range of from 300 to 800 Dalton, preferably 400 to 750 Dalton and, most preferably, 400 to 600 Dalton.

Preferably, the hydrophilic-lipophilic balance (HLB) value is in the range of 8 to 16, preferably 9 to 15 and, most preferably, 11 to 14.

The amphiphilic nonionic surfactants (A1) are customary and known materials and are available from BASF SE under the trademark Lutensol™.

The amphiphilic nonionic surfactant (A2) also comprises at least one hydrophobic group (a21) and at least one hydrophilic group (a22).

This means that the amphiphilic nonionic surfactant (A2) contains more than one group (a22), e.g., 2, 3 or more groups (a22) which are separated from each other by hydrophobic groups (a21) or it contains more than one group (a22), e.g., 2, 3 or more groups (a22), which are separated from each other by hydrophobic groups (a21).

The amphiphilic nonionic surfactant (A2) can have different blocklike general structures. Examples of such general blocklike structures are:
a21-a22,
a21-a22-a21,
a22-a21-a22,
a22-a21-a22-a21,
a21-a22-a21-a22-a21, and
a22-a21-a22-a21-a22.

Most preferably, the blocklike general structure a21-a22 is used.

Preferably, the hydrophobic groups (a11) described above are used as the hydrophobic groups (a21).

The hydrophilic group (a22) comprises oxyethylene monomer units (a221).

Moreover, the hydrophilic group (a22) comprises at least one type of substituted oxyalkylene monomer units (a222), wherein the substituents are selected from the group consisting of alkyl, cycloalkyl, aryl, alkyl-cycloalkyl, alkyl-aryl, cycloalkyl-aryl and alkyl-cycloalkyl-aryl groups.

Preferably, the oxyalkylene monomer units (a222) are derived from substituted oxiranes wherein the substituents are selected from the group consisting of alkyl, cycloalkyl, aryl, alkyl-cycloalkyl, alkyl-aryl, cycloalkyl-aryl and alkyl-cycloalkyl-aryl groups.

The substituents themselves can also carry inert substituents, i.e., substituents which do not adversely affect the copolymerization of the oxiranes and the surface activity of the amphiphilic nonionic surfactants (A2). Examples of such inert substituents are fluorine and chlorine atoms, nitro groups and nitrile groups. The inert substituents are used in such amounts that they do not adversely affect the hydrophilic-hydrophobic balance of the surfactant (A2). Preferably, the substituents do not carry such inert substituents.

The substituents of the oxiranes are preferably selected from the group consisting of alkyl groups having 1 to 10 carbon atoms, cycloalkyl groups having 5 to 10 carbon atoms in spirocyclic, exocyclic and/or annealed configuration, aryl groups having 6 to 10 carbon atoms, alkyl-cycloalkyl groups having 6 to 20 carbon atoms, alkyl-aryl groups having 7 to 20 carbon atoms, cycloalkyl-arylgroup having 11 to 20 carbon atoms, and alkyl-cycloalkyl-aryl groups having 12 to 30 carbon atoms.

Examples of suitable alkyl groups are methyl, ethyl, propyl, isopropyl, n-butyl, sec-butyl, tert-butyl, n-pentyl, 2- and 3-methylpentyl, 2,2-dimethylpropyl, n-hexyl, 2-, 3- and 4-methylpentyl, 2,2- and 3,3-dimethylbutyl, n-heptyl, 2,3-dimethylpentyl, 2,3,3-trimethylbutyl, n-octyl, iso-octyl, 2-ethylhexyl, n-nonyl, 2-ethyl-3,4-dimethylpentyl, and n-decyl; preferably, methyl, ethyl, propyl, isopropyl, n-butyl, n-pentyl, and n-hexyl.

Examples of suitable cycloalkyl groups are cyclopentyl, cyclohexyl, cyclopentane-1,1-diyl, cyclopentane-1,2-diyl, cyclohexane-1,1-diyl, and cyclohexane-1,2-diyl.

Examples of suitable aryl groups are phenyl and 1- and 2-naphthyl.

Examples of suitable alkyl-cycloalkyl groups are cyclopentyl- and cyclohexylmethyl, 2-cyclopentyl- and 2-cyclohexyleth-1-yl, 3-cyclopentyl- and 3-cyclohexylprop-1-yl, and 4-cyclopentyl- and 4-cyclohexyl-n-but-1-yl.

Examples of suitable alkyl-aryl groups are phenylmethyl, 2-phenyleth-1-yl, 3-phenylprop-1-yl, and 4-phenyl-n-but-1-yl.

Examples of suitable cycloalkyl-aryl groups are 4-phenyl-cyclohex-1-yl, 4-cyclohexyl-phen-1-yl, and 2,3-dihydroindene-1,2-diyl.

Examples of suitable alkyl-cycloalkyl-aryl groups are cyclohexyl-phenyl-methyl and 2-cyclohexyl-2-phenyl-eth-1-yl.

Examples for particularly preferred substituted oxiranes are methyl, ethyl, 2,2- and 2,3-dimethyl, 2,2,3-trimethyl, 2,2, 3,3-tetramethyl, 2-methyl-3-ethyl, 2,2 and 2,3-diethyl, n-propyl, 2-methyl-3-n-propyl, n-butyl, n-pentyl, n-hexyl, n-heptyl, n-octyl, n-nonyl, n-decyl, cyclopentyl, cyclohexyl, phenyl, and naphthyl oxirane; 1,2-epoxy-cyclohexane and -cyclopentane; 1-oxa-3-spiro[3.4]-heptane 1-oxa-3-spiro [3.5]-octane; and 1,2-epoxy-2,3-dihydroindene.

Methyl oxirane(propyleneoxide) and ethyl oxirane(butylene oxide) are most particularly preferably used.

Preferably, the hydrophilic group (a22) consists of the monomer units (a221) and (a222).

The polyoxyalkylene group contains the monomer units (a221) and (a222) in random, alternating, gradient and/or blocklike distribution. This means, that one hydrophilic group (a22) can have only one type of distribution, i.e.,
random: . . . -a221-a221-a222-a221-a222-a222-a222-a221-a222- . . . ;
alternating: . . . -a221-a222-a221-a222-a221- . . . ;
gradient: . . . a221-a221-a221-a222-a221-a222-a222-a222-a222-a222- . . . ; or
blocklike: . . . -a221-a221-a221-a221-a222-a222-a222- . . . .

Or the hydrophilic group (a22) can contain at least two types of distributions, e.g., an oligomeric or polymeric segment having a random distribution and an oligomeric or polymeric segment having an alternating distribution.

Preferably, the hydrophilic group (a22) has only one type of distribution. Most preferably, the distribution is random or blocklike.

The molar ratio of oxyethylene monomer units (a221) to oxyalkylene monomer units (a222) can vary broadly and, therefore, can be adjusted most advantageously to the particular requirements of the composition, the method and the use of the invention.

Preferably the molar ratio (a221):(a222) is from 100:1 to 1:1, more preferably, from 60:1 to 1.5:1 and, most preferably, from 50:1 to 1.5:1.

Also the degree of polymerization of the oligomeric and polymeric polyoxyalkylene groups (a22) can vary broadly and, therefore, can be adjusted most advantageously to the particular requirements of the composition, the method and the use of the invention. Preferably, the degree of polymerization is in the range of from 5 to 100, preferably 5 to 90, and most preferably, 5 to 80.

The amphiphilic nonionic surfactants (A2) are customary and known materials and are commercially available from BASF SE under the trademark Plurafac™ or from Dow under the trademark Triton™.

The amphiphilic nonionic surfactants (A3) are alkyl polyglucosides (APG). The APG preferably have an average degree of polymerization of 1 to 5, preferably 1.2 to 1.5. Preferably, the alkyl groups of the APG have 8 to 16 carbon atoms and, most preferably, 12 to 14 carbon atoms. The APG are customary and known materials and are available from Cognis under the trademark Glucopon™.

The concentration of the surfactants (A) in the composition of the invention can vary broadly, and, therefore, can be adjusted most advantageously to the particular requirements of the composition, the method and the use of the invention. Preferably, the concentration is in the range of 1 ppm to 1%, more preferably 10 ppm 0.9% by weight, even more preferably 100 ppm to 0.8% by weight and, most preferably, 200 ppm to 0.6% by weight, the weight specifications being based on the complete weight of the composition of the invention.

The composition of the invention contains as the second essential ingredient at least one, preferably one metal chelating agent (B) selected from the group consisting of polycarboxylic acids having at least 3 carboxylic acid groups.

Preferably, the metal chelating agent (B) is selected from the group consisting of propane-1,2,3-tricarboxylic acid, citric acid, butane-1,2,3,4-tetracarboxylic acid, pentane-1,2,3,4,5-pentacarboxylic acid, trimellitic acid, trimesinic acid, pyromellitic acid, mellitic acid and oligomeric and polymeric polycarboxylic acids containing or consisting of acrylic acid and/or methacrylic acid, preferably acrylic acid, monomer units.

Preferably, the oligomeric and polymeric polycarboxylic acids (B) have an weight average molecular weight of less than 20,000 Dalton and, more preferably, less than 15,000 Dalton. Most preferably, the weight average molecular weight is from 3000 to 10,000 Dalton. The oligomeric and polymeric polycarboxylic acids (B) can be homopolymers, i.e., polyacrylic acid or polymethacrylic acid, preferably polyacrylic acid, homopolymers or copolymers. The copolymers may contain essentially any suitable other monomeric units, preferably monomeric units comprising at least one carboxylic acid group, in particular, monomeric units derived from fumaric, maleic, itaconic, aconitic, mesaconic, citraconic and methylenemalonic acid and maleic anhydride.

The oligomeric and polymeric polycarboxylic acids (B) are customary and known materials and are available from BASF SE under the trademark Sokalan™.

The concentration of the metal chelating agents (B) in the composition of the invention can vary broadly and, therefore, can be adjusted most advantageously to the particular requirements of a given composition, use and method of the invention. Preferably, the concentration is in the range of from 10 ppm to 2% by weight, more preferably, 100 ppm to 1% by weight, even more preferably 0.05 to 1% by weight and, most preferably, 0.1 to 1% by weight.

The composition of the invention can contain at least one and, preferably, one metal corrosion inhibitor (C) having no nitrogen-containing functional groups, as for example, amine, amide, imide, hydrazine, hydroxyl amine, urethane, triazole, tetrazole groups and similar nitrogen-containing functional groups as well as cationic groups derived from such nitrogen-containing functional groups. Preferably, corrosion inhibitors (C) preventing the corrosion of copper, i.e., copper corrosion inhibitors (C), are used.

More preferably, the metal corrosion inhibitor (C) is selected from the group consisting of water-soluble and water dispersible, preferably, water-soluble compounds having at least two hydroxy groups which do not dissociate in the aqueous medium.

"Not dissociating" means that the dissociation constant for the reaction R—OH→R—O$^-$+H$^+$ of the hydroxy group in the aqueous phase is very low or, for practical purposes, virtually zero.

Even more preferably, the metal corrosion inhibitor (C) is selected from the group consisting of polyhydric alcohols, polyhydric phenols and carboxylic acids having at least two hydroxy groups.

Preferably, the polyhydric alcohol (C) is selected from the group consisting of glycerol, trimethylolpropane, pentaerythritol, alditols, cyclitols, carbohydrates and the dimers and oligomers of glycerol, trimethylolpropane, pentaerythritol, alditols and cyclitols.

More preferably, the alditol (C) is selected from the group consisting of tetritols, pentitols, hexitols, heptitols, and octitols.

Even more preferably, the tetritol (C) is selected from erythritol, threitol and mixtures thereof; the pentitol (C) is selected from the group consisting of arabinitol, ribitol and xylitol, the hexitol (C) is selected from the group consisting of galactitol, mannitol, glucitol, allitol, altritol, iditol and mixtures thereof.

Even more preferably, the dimer (C) is selected from the group consisting of the dimers of glycerol, trimethylolpropane, erythritol, threitol and pentaerythritol and mixtures thereof as well as maltitol, isomalt, lactitol and mixtures thereof.

Particularly preferably, the oligomer (C) is selected from the group consisting of tri-, tetra-, penta-, hexa-, hepta-, octa-, nona-, deca-, undeca- and dodecaglycerol, -trimethylolpropane, -erythritol, -threitol and -pentaerythritol and mixtures thereof.

Even more preferably, the cyclitols (C) are selected from 1,2,3,4-tetrahydroxycyclohexane, 1,2,3,4,5-pentahydroxycyclohexane, inositols and mixtures thereof.

Even more preferably, the inositol (C) is selected from the group consisting of myo-, scyllo-, muco-, chiro-, neo-, allo-, epi- and cis-inositol and mixtures thereof. Most preferably, myo-inositol (C) is used.

Even more preferably, the carbohydrate (C) is selected from the group consisting of monosaccharides.

Particularly preferably, the monosaccharide (C) is selected from the group consisting of allose, altrose, glucose, mannose, idose, galactose and talose, in particular galactose.

Even more preferably, the polyhydric phenol (C) is selected from the group consisting of pyrocatechol, resorcinol, hydroquinone, pyrogallol, 1,2,4-trihydroxybenzene and phloroglucinol More preferably, the carboxylic acids (C) having at least 2 hydroxy groups are selected from the group consisting of sugar acids and benzene carboxylic acids having at least 2 hydroxy groups.

Even more preferably, the sugar acid (C) is selected from the group consisting of glyceric acid, tartaric acid, threonic acid, erythronic acid, xylonic acid, glucuronic acid, ascorbic acid, gluconic acid, galacturonic acid, iduronic acid, mannuronic acid, glucuronic acid, guluronic acid, glycuronic acid, glucaric acid, ulusonic acid, lactobionic acid and mixtures thereof.

Even more preferably, the benzene carboxylic acid (C) is selected from the group consisting of 2,3-, 2,4-, 2,5-, 2,6-, 3,4- and 3,5-dihydroxybenzoic acid and 2,4,6-, 2,4,5-, 2,3,4- and 3,4,5-trihydroxybenzoic acid (gallic acid).

Most preferably, erythritol and gallic acid are used as metal corrosion inhibitors (C).

The concentration of the metal corrosion inhibitors (C) in the composition of the invention can vary broadly and, therefore, can be adapted most advantageously to the particular requirements of a given composition, use and method of the invention. Preferably, the concentration is in the range of from 10 ppm to 2% by weight, more preferably, 100 ppm to 1.5% by weight and, most preferably, 250 ppm to 1% by weight, the weight specifications being based on the complete weight of the composition.

The composition of the invention can also contain at least one functional additive (D) which is nitrogen-free in the above described sense. Preferably, the functional additive (D) is selected from the group consisting of dyes, biocides and preservatives.

The preparation of the composition of the invention does not exhibit any particularities but can be carried out by dissolving or dispersing the above-described ingredients (A) and (B) and optionally (C) and/or (D) in an aqueous medium, in particular, in de-ionized water and, most preferably, in ultrapure water. For this purpose, the customary and standard mixing processes and mixing apparatuses such as agitated vessels, in-line dissolvers, high shear impellers, ultrasonic mixers, homogenizer nozzles or counterflow mixers, can be used.

The composition of the invention is excellently suited for the use of the invention, i.e., the removal of residues and contaminants from the surface of semiconductor substrates useful for manufacturing microelectronic devices.

The residues and contaminants can be abrasive particles, processing residues, metal oxides including copper oxide, metallic ions, salts, passivating films and abraded or decomposed low-k or ultra-low-k dielectric materials.

Suitable semiconductor substrates are based on semiconductor materials such as gallium arsenide, boron nitride silicon, crystalline silicon, polysilicon, amorphous silicon or epitaxial silicon.

The semiconductor substrates can comprise electrically conductive layers which function as wirings, vias, interconnects and barrier layers. Preferably, the electrically conductive layers consist of metals and metal alloys. More preferably, the metals are selected from the group consisting of titanium, tantalum, tungsten, rhenium, ruthenium, osmium, rhodium, iridium, palladium, platinum, copper, silver, gold and aluminum. Most preferably, the metal is selected from copper, copper alloys such as copper-aluminum alloys, tantalum, tantalum nitride, titanium nitride or and ruthenium. The metals may also form multilayers such as titanium/titanium nitride/copper, tantalum/tantalum nitride/copper, ruthenium/copper or tantalum/ruthenium/copper multilayers.

The semiconductor substrates can furthermore comprise electrically insulating dielectric layers such as silica, silicon carbide, silicon nitride, silicon carbon nitride, carbon doped silica, organo silica glasses (OSG), organofluorosilicate glasses (OFSG) and organic polymers. More preferably, the electrically insulating dielectric layers contain or consist of low-k and ultra-low-k materials as described, for example, in the American patent applications US 2005/0176259 A1, page 2, paragraphs [0025] to [0027], US 2005/0014667 A1, page 1, paragraph [0003], US 2005/0266683 A1, page 1, paragraph [0003] and page 2, paragraph [0024] or US 2008/0280452 A1, paragraphs [0024] to [0026] or in the American patent U.S. Pat. No. 7,250,391 B2, column 1, lines 49 to 54 or in the European patent application EP 1 306 415 A2, page 4, paragraph [0031].

Moreover, the semiconductor substrates may also contain antireflective coatings and photoresists.

The semiconductor substrates are useful for manufacturing microelectronic devices, in particular microelectronic devices containing LSI-, VLSI- or ULSI-ICs down to the 20 nm node and even lower. As is known in the art, "node" designates the line-space dimension of the smallest three-dimensional features, patterns or structures of an IC.

Although the composition of the invention can be advantageously used for other purposes, it is particularly well-suited for the method of the invention.

The method of the invention comprises the step of removing the above-described residues and contaminants from the surface of the above-described semiconductor substrates by contacting them at least once with the composition of the invention.

Consequently, the method of the invention cannot only be used for the post-CMP cleaning but also for photoresists stripping and post-etch residue removal. However, the method of the invention exhibits its particular advantages in the post-CMP cleaning of the above-described semiconductor substrates.

As is known in the art, a typical equipment for the CMP consists of a rotating platen which is covered with a polishing pad. The wafer is mounted on a carrier or chuck with its upper side down facing the polishing pad. The carrier secures the wafer in the horizontal position. This particular arrangement of polishing and holding device is also known as the hard-platen design. The carrier may retain a carrier pad which lies between the retaining surface of the carrier and the surface of the wafer which is not being polished. This pad can operate as a cushion for the wafer.

Below the carrier, the larger diameter platen is also generally horizontally positioned and presents a surface parallel to that of the wafer to be polished. Its polishing pad contacts the wafer surface during the planarization process. During the CMP process of the invention, the composition of the invention is applied onto the polishing pad as a continuous stream or in dropwise fashion.

Both the carrier and the platen are caused to rotate around their respective shafts extending perpendicular from the carrier and the platen. The rotating carrier shaft may remain fixed in position relative to the rotating platen or may oscillate horizontally relative to the platen. The direction of rotation of the carrier typically, though not necessarily, is the same as that of the platen. The speeds of rotation for the carrier and the platen are generally, though not necessarily, set at different values.

Customarily, the temperature of the platen is set at temperatures between 10 and 70° C.

For further details, reference is made to the international patent application WO 2004/063301 A1, in particular page 16, paragraph [0036] to page 18, paragraph [0040] in conjunction with the FIG. 1.

A large variety of conventional cleaning tools and methods can be used for the method of the invention such as megasonic cleaners and brush cleaners and combinations thereof. Typically, the brushes are made up of soft and porous polyvinyl alcohol materials. The brushes may have different shapes depending on the manufacturer of the processing tool. Most common shapes are rollers, discs and pencils.

After contacting the semiconductor substrates with the composition of the invention, the semiconductor substrates are removed from the composition and dried. The drying step can be carried out as described, for example, in the American patent application US2009/291873 A1, page 4, paragraph [0022].

The cleaning or removal performance, i.e., the degree of the removal of residues and contaminants, of the composition of the invention and the method of invention can be determined in accordance with various methods. Preferably, the performance is evaluated by comparing untreated semiconductor surfaces with the respective semiconductor surfaces that have been treated with the composition of the invention and the method of the invention. To this end, scanning electron microscopy (SCM) and/or atomic force microscopy (AFM) can be carried out and the images obtained from the respective treated and the untreated semiconductor surfaces can be compared with each other.

EXAMPLES AND COMPARATIVE EXPERIMENTS

Examples 1 and 2 and Comparative Experiments C1 and C2

The Screening of Amphiphilic Nonionic Surfactants

Tests were conducted to evaluate the relative cleaning performance of surfactants in aqueous cleaning solutions.

Surfactant solution 1 (Example 1) was prepared by mixing deionized water with 0.2% by weight of an amphiphilic nonionic surfactant on the basis of a C10-Guerbet alcohol having a degree of ethoxylation of 8, a hydroxyl number of 110 mg KOH/g, an average molecular weight of 500 Dalton and a hydrophilic-lipophilic balance (HLB) value of 13 (Lutensol™ XP 80 of BASF SE).

Solution 2 (Example 2) was prepared by mixing deionized water with 0.2% by weight of an amphiphilic nonionic surfactant on the basis of a C10-Guerbet alcohol having a degree of ethoxylation of 7, a hydroxyl number of 125 mg KOH/g, an average molecular weights of 445 Dalton and an HLB value of 12 (Lutensol™ XP 70 of BASF SE).

For purpose of comparison, two additional surfactant solutions were prepared:

Solution 3 (Comparative Experiment C1) was prepared by mixing 0.2 wt % of an amphiphilic nonionic surfactant on the basis of an ethoxyated C8-C10 alcohol (Triton™ DF16 of Dow) with deionized water.

Solution 4 (Comparative Experiment C2) was prepared by mixing 0.2 wt % of an ethoxylated octyl phenol having a degree of ethoxylation of 10 (Triton™ X100 of Dow) with deionized water.

The pH of each cleaning solution was 4.

Dip tests were conducted using electrochemically plated copper coupons. In the following procedure, the silica slurry was composed of 0.5 wt % of a 50% by weight colloidal silica suspension (Ludox™ TM 50) at pH 4. Sample coupons were first dipped into 0.02% by weight $HNO_3$ for 35 s, rinsed with deionized water, and thereafter dipped into the silica slurry for 5 min, and then rinsed by deionized water for 15 s. One coupon was dried and its loading with silica abrasive particles was determined by scanning electron microscopy (SEM) for purposes of comparison. The other coupons were then dipped into the subject surfactant solutions for 2 min and rinsed with deionized water for 15 s. The treated coupons were hung to air dry under ambient conditions. The dried coupons were examined by SEM for evidence of remaining silica abrasive particles. The cleaning performances of the subject surfactant solutions were evaluated by comparing the images obtained by SEM from the treated coupons with the SEM images obtained from the untreated coupon.

The results obtained demonstrated that that the solutions 1 and 2 (Examples 1 and 2) performed best, i.e., the solutions 1 and 2 already exhibited a good cleaning performance as exemplified by a nearly complete removal of the silica particles. Contrary to this, the solutions 3 and 4 (Comparative Experiments C1 and C2) did not efficiently remove the silica particles.

Examples 3 to 7

The Screening of Amphiphilic Nonionic Surfactants on the Basis of C10-Guerbet Alcohols A series of aqueous solutions of several amphiphilic nonionic surfactants on the basis of C10- of a Guerbet alcohols (Lutensol™ XP series of BASF SE) were prepared to evaluate the relationship between surfactant properties including hydrophilic lipophilic balance (HLB), degree of ethoxylation (ethoxylate alcohol number; E.O.), surface tension and cleaning performance in aqueous cleaning solutions. The solutions were prepared by mixing the Lutensol™ XP surfactants with deionized water at pH 4.

Table 1 gives an overview over the concentrations of the solutions of the Examples 1 to 7.

TABLE 1

Concentrations and Surface Tensions of the Solutions of the Examples 1 to 7 and Physical Properties and the Compositions of the Amphiphilic Nonionic Surfactants

| Example No. | Lutensol ™ XP Series | Concentration/% by weight | HLB value | E.O. Number | Surface Tension (0.1% by Weight Weight Aqueous Solution) |
|---|---|---|---|---|---|
| 3 | XP 40[a] | 0.08 | 9 | 4 | 27 |
| 4 | XP 60[b] | 0.2 | 11 | 6 | 26 |
| 5 | XP 70[c] | 0.2 | 12 | 7 | 26 |

TABLE 1-continued

Concentrations and Surface Tensions of the Solutions of the Examples 1 to 7 and Physical Properties and the Compositions of the Amphiphilic Nonionic Surfactants

| Example No. | Lutensol ™ XP Series | Concentration/% by weight | HLB value | E.O. Number | Surface Tension (0.1% by Weight Aqueous Solution) |
|---|---|---|---|---|---|
| 6 | XP 80[d] | 0.2 | 13 | 8 | 27 |
| 7 | XP 140[e] | 0.2 | 14 | 16 | 35 |

[a] average molecular weight 330 Dalton;
[b] average molecular weight 410 Dalton;
[c] average molecular weight 445 Dalton;
[d] average molecular weight 500 Dalton;
[e] average molecular weight 750 Dalton;

The solutions were evaluated for cleaning performance according to the dip test procedure set forth in Example 1. The results obtained demonstrated that all the solutions of the Examples 1 to 7 were capable of removing the silica particles. However, the solutions of the Examples 5 and 6 had the best cleaning performance as evidenced by a nearly quantitative removal of the silica particles.

Examples 8 to 12

The Influence of the pH Value on the Cleaning Performance and the Static Etch Rate (SER)

The solutions of the Examples 8 to 12 were prepared by mixing 0.2% by weight Lutensol™ XP80 with deionized water and adjusting the pH with 0.6% by weight of nitric acid.

The solutions of the Examples 8 to 12 were evaluated for cleaning performance according to the dip test procedure set forth in Example 1.

Deionized water samples at pH 2, 3, 4, 4.5 and 6 were prepared to evaluate the copper static etching rate (SER). The SER was determined by a standard four-point probe technique. To this end, electrochemical planarized copper wafer pieces were submersed in these stirred samples for 5 min at constant temperature (22° C.). Four point probe measurements for SER were made on these pieces prior to and after these treatments. The copper SERs are reported in Å per min in Table 2.

The results obtained indicated that the cleaning solutions of the Examples 8 to 10 having a pH value lower than 4 performed better in the dip test. The solutions of the examples 11 and 12 did not perform as well at pH higher than 4. However, lower pH values lead to an undesirably high SER of copper.

TABLE 2

The Influence of the pH Value on the Cleaning Performance and the Static Etch Rate (SER)

| Example No. | pH | SER (A/min) | Cleaning Performance |
|---|---|---|---|
| 8 | 2 | 76.967 | +++[a] |
| 9 | 3 | 10.032 | +++[a] |
| 10 | 4 | 2.885 | +++[a] |
| 11 | 4.5 | 1.564 | ++[b] |
| 12 | 6 | −0.334 | +[c] |

[a] +++ = high performance, quantitative removal of particles;
[b] ++ = lesser performance, removal of particles but not quantitative;
[c] + = the major part of particles were not removed;

Examples of 13 and 14 and Comparative Experiments C3 to C7

The Cleaning Performance of Solutions Containing an Amphiphilic Nonionic Surfactant and Carboxylic Acids The solutions of the Examples 13 and 14 and of the Comparative Experiments C3 to C7 were prepared to show the relationship of carboxyl group number and cleaning performance in aqueous cleaning solutions. Their compositions are listed in Table 3. Their pH was adjusted by KOH. Their cleaning performance was evaluated according to the dip test procedure set forth in Example 1 and compiled and the Table 3.

TABLE 3

The Cleaning Performance of Solutions Containing an Amphiphilic Nonionic Surfactant and Carboxylic Acids

| Example/ Comparative Experiment No. | Cleaning (Amounts in Percent by Weight; wt %) | Performance |
|---|---|---|
| 13 | 0.3 wt % citric acid + 0.2 wt % Lutensol ™ XP80, pH 6 | ++++[a] |
| 14 | 0.3 wt % polyacrylic acid + 0.2 wt % Lutensol XP80, pH 6 | ++++[a] |
| C3 | 0.3 wt % citric acid, pH 6 | ++[c] |
| C4 | 0.2 wt % Lutensol ™ XP80, pH 6 | +[d] |
| C5 | 0.3 wt % ascorbic acid + 0.2 wt % Lutensol ™ XP80, pH 6 | ++[c] |
| C6 | 0.3 wt % acetic acid + 0.2 wt % Lutensol ™ XP80, pH 6 | ++[c] |
| C7 | 0.3 wt % oxalic acid + 0.2 wt % Lutensol X ™ P80, pH 6 | +++[b] |

[a] ++++ = excellent performance, quantitative removal of particles;
[b] +++ = good performance, nearly quantitative removal of particles
[c] ++ = lesser performance, only minor removal of particles;
[d] + = the major part of particles were not removed;

The results obtained demonstrated that the solutions of the Examples 13 and 14 performed better than the other solutions of the Comparative Experiments C3 to C7. This corroborates a synergism with regard to the cleaning performance of chelating agents such as citric acid or polyacrylic acid having more than 3 carboxylic acid groups with Lutensol™ XP 80 at neutral pH. The particles could be removed quantitatively from the copper surface without color changes.

Examples 15 to 18 and Comparative Experiment C8

The Influence of the Concentration of the Amphiphilic Nonionic Surfactant on the Cleaning Performance Tests were conducted to evaluate the relative cleaning performance of cleaning solutions of varying surfactant concentration. Cleaning solutions were prepared by combining 0.5 wt % citric acid with Lutensol™ XP 80 in deionized water at pH 6. KOH was applied as pH adjustor. The concentration of Lutensol™ XP 80 was either 0% by weight (Comparative Experiment C8), 0.05% by weight (Example 15), 0.1% by weight (Example 16), 0.15% by weight (Example 17) or 0.2% by weight (Example 18). The prepared cleaning solutions were evaluated for cleaning performance according to the dip test procedure set forth in Example 1. The results obtained clearly indicated that the cleaning solution of Example 18 performed best.

The silica particle size distribution of colloidal silica in water and in Lutensol™ XP 80 solutions were measured at concentrations of 0.05, 0.1, 0.15 and a 0.2% by weight. The results obtained showed an increase of the average particle size with increasing concentration of the amphiphilic nonionic surfactant indicating an agglomeration of the particles in the presence of the surfactant. It is believed that this agglomeration contributed beneficially to the cleaning performance.

Examples 19 and 20 and Comparative Experiment C9

The Cleaning Performance of Solutions Containing an Amphiphilic Nonionic Surfactant and a Copper Corrosion Inhibitor The copper-specific corrosion inhibitors gallic acid (Example 19), erythritol (Example 20) and 1,2,4-triazole (Comparative Experiment C9) were tested in cleaning solutions according to the dip test procedure set forth in Example 1. The cleaning solution of Example 19 was prepared by mixing 0.05% by weight citric acid, 0.2% by weight Lutensol™ XP 80, 0.05% by weight gallic acid with deionized water. The cleaning solution of Example 20 was prepared by mixing 0.05% by weight citric acid, 0.2% by weight Lutensol™ XP 80 and 0.05% by weight erythritol with deionized water. The cleaning solution of the Comparative Experiment C9 was prepared by mixing 0.05% by weight citric acid, 0.2% by weight Lutensol trademarks XP 80, 0.05% by weight and 1,2,4-triazole with deionized water. The results obtained clearly indicated that the solutions of the Examples 19 and 20 performed significantly better than the solution of the Comparative Experiment C9.

Examples 21 to 26

The Influence of the Copper Corrosion Inhibitors on the Static Etch Rate (SER) of Cleaning Solutions Containing an Amphiphilic Nonionic Surfactant and a Polycarboxylic Acid The cleaning solutions that Examples 21 to 26 were prepared to evaluate the copper SER. The composition of the solutions are given in the Table 4. The copper SER was determined by the weight loss method. The copper disk were submersed in the stirred solutions for 5 min at constant temperature (22° C.). Weight measurements were made on these disks prior to and after these treatments. The copper SERs obtained are reported in Å per min in Table 4.

The results indicated that the addition of the corrosion inhibitors slowed down the copper SER and effectively prevented undesirable corrosion during the cleaning process.

TABLE 4

The Influence of the Copper Corrosion Inhibitors on the Static Etch Rate (SER) of Cleaning Solutions Containing an Amphiphilic Nonionic Surfactant and the Polycarboxylic Acid

| Example No. | Composition (Amounts in Percent by Weight, wt %) | pH | Copper SER (Å/min) |
|---|---|---|---|
| 21 | 0.05 wt % citric acid + 0.2 wt % Lutensol ™ XP 80 | 6 | 7.30 |
| 22 | 0.05 wt % citric acid + 0.2 wt % Lutensol ™ XP 80 + 0.05 wt % gallic acid | 6 | 1.54 |
| 23 | 0.05 wt % citric acid + 0.2 wt % Lutensol ™ XP 80 + 0.05 wt % erythritol | 6 | 1.92 |
| 24 | 0.5 wt % citric acid + 0.2 wt % Lutensol ™ XP 80 | 6 | 107.54 |
| 25 | 0.5 wt % citric acid + 0.2 wt % Lutensol ™ XP 80 + 0.05 wt % gallic acid | 6 | 25.60 |
| 26 | 0.5 wt % citric acid + 0.2 wt % Lutensol ™ XP 80 + 0.05 wt % erythritol | 6 | 18.43 |

Examples 27 and 28

The Cleaning Performance of Cleaning Solutions Containing an Alkyl Polyglucoside (APG) As the Amphiphilic Nonionic Surfactant The solution of the Example 27 was prepared by mixing 0.1% by weight of an alkyl polyglucoside (APG) (Glucopon™ from Cognis) and 0.05% by weight citric acid with deionized water at pH 6. The solution of the Example 28 was prepared by mixing 0.1 wt % Glucopon™ and 0.05% polyacrylic acid (Sokalan™ 12S from BASF SE) with deionized water at pH 6. $HNO_3$ was applied to adjust pH value. The cleaning solutions were evaluated according to the dipping test procedure set forth in Example 1. The results obtained indicated that the cleaning solutions of the Examples 27 and 28 could efficiently and quantitatively remove the abrasive particles.

Examples 29 to 34

The Influence of Alkyl Polyglucoside (APG) on the Copper Static Etch Rate (SER)

The copper SERs of the cleaning solutions of the Examples 29 to 34 were tested according to the four-point probe technique. The compositions of the cleaning solutions are reported in Table 5. Copper SERs are reported in A per min in Table 5.

The results indicated that the APG Glucopon™ could decrease copper SER without sacrificing the abrasive particles removal. Therefore, Glucopon™ could be applied both as surfactant and inhibitor in cleaning solutions.

TABLE 5

The Influence of Alkyl Polyglucoside (APG) on the Copper Static Etch Rate (SER)

| Example No. | Composition (Amounts in Percent by Weight, wt %) | SER (Å/min) |
|---|---|---|
| 29 | 0.05 wt % citric acid + 0.1 wt % Glucopon ™ n, pH 6 | −0.46 |
| 30 | 0.05 wt % citric acid + 0.2 wt % Lutensol ™ XP80, pH 6 | 5.31 |
| 31 | 0.05 wt % citric acid + 0.2 wt % Lutensol ™ XP80 + 0.05 wt % erythritol, pH 6 | 0.87 |
| 32 | 0.05 wt % Sokalan ™ 12S[a] + 0.1 wt % Glucopon ™, pH 6 | 0.24 |
| 33 | 0.05 wt % Sokalan ™ 12S[a] + 0.2 wt % Lutensol ™ XP80, pH 6 | 2.9 |
| 34 | 0.05 wt % Sokalan ™ 12S[a] + 0.2 wt % Lutensol ™ XP80 + 0.05 wt % erythritol, pH 6 | −1.6 |

[a] polyacrylic acid of BASF SE;

Example 35 and 36

The Copper Oxide Removal Performance of Cleaning Solutions Containing an Amphiphilic Nonionic Surfactant, a Polycarboxylic Acid and a Copper Corrosion Inhibitor The cleaning solutions of the Examples 22 and 23 (Examples 35 and 36) were evaluated for the copper oxide removal. To this end, copper strips were immersed in 0.02% by weight $HNO_3$ for 35 s, rinsed with deionized water and cut in two halfs. Thereafter, one half of each copper strip was placed in 31% by weight $H_2O_2$ for 2 min, rinsed by water, and dried. A uniform brown oxide was formed on the oxidized copper strips. Then, the oxidized copper strips were submersed in the subject cleaning solutions for 2 min and were thereafter removed from the cleaning solutions, rinsed with deionized water, dried and compared with the respective non-oxidized copper strips by visual inspection. The color changes were evidence of oxide removal: the results obtained indicated that the cleaning solution of the Examples 22 and 23 performed very well as copper oxide removal agents, as evidenced by the disappearance of the brown color of the copper oxide.

We claim:

1. An aqueous, nitrogen-free cleaning composition having a pH of from 5 to 8, the aqueous, nitrogen-free cleaning composition consisting of comprising:
   at least one surfactant selected from the group consisting of a first amphiphilic nonionic, water-soluble or water-dispersible surfactant, a second amphiphilic nonionic, water-soluble or water-dispersible surfactant, and an amphiphilic nonionic, water-soluble or water-dispersible alkyl polyglucoside surfactant, and
   at least one water-soluble or water-dispersible metal chelating agent selected from the group consisting of a polycarboxylic acid having at least 3 carboxylic acid groups,
   optionally, at least one water-soluble or water-dispersible metal corrosion inhibitor having no nitrogen-containing functional groups,
   optionally, at least one functional additive selected from the group consisting of dyes, biocides and preservatives, and
   optionally, at least one pH adjuster,
   wherein the first amphiphilic nonionic, water-soluble or water-dispersible surfactant comprises:
   a hydrophobic group selected from the group consisting of a branched alkyl group having 5 to 20 carbon atoms; and
   a hydrophilic group comprising an oxyethylene monomer unit;
   wherein the second amphiphilic nonionic, water-soluble or water-dispersible surfactant comprises:
   a hydrophobic group selected from the group consisting of a branched alkyl group having 5 to 20 carbon atoms; and
   a hydrophilic group selected from the group consisting of a polyoxyalkylene group comprising an oxyethylene monomer unit and a polyoxyalkylene group comprising a substituted oxyalkylene monomer unit in which a substituent is selected from the group consisting of an alkyl, cycloalkyl, aryl, alkyl-cycloalkyl, alkyl-aryl, cycloalkyl-aryl, and alkyl-cycloalkyl-aryl group; and
   wherein the polyoxyalkylene group of the hydrophilic group comprises the oxyalkylene monomer unit in random, alternating, gradient, and/or block-structure, distribution.

2. The aqueous, nitrogen-free cleaning composition according to claim 1,
   wherein the water-soluble or water-dispersible metal corrosion inhibitor having no nitrogen-containing functional groups is present.

3. The aqueous, nitrogen-free cleaning composition according to claim 1,
   wherein a metal of the water-soluble or water-dispersible metal-chelating agent is copper.

4. The aqueous nitrogen-free cleaning composition according to claim 1,
   wherein the metal chelating agent is at least one selected from the group consisting of propane-1,2,3-tricarboxylic acid, citric acid, butane-1,2,3,4-tetracarboxylic acid, pentane-1,2,3,4,5-pentacarboxylic acid, trimellitic acid, trimesinic acid, pyromellitic acid, mellitic acid, an oligomeric polycarboxylic acid, and a polymeric polycarboxylic acids,
   wherein the oligomeric polycarboxylic acid, the polymeric polycarboxylic acid, or both comprise an acrylic acid monomer unit, a methacrylic acid monomer unit, or a combination thereof.

5. The aqueous, nitrogen-free cleaning composition according to claim 2, wherein the water-soluble or water-dispersible metal corrosion inhibitor is present, and
   wherein the water-soluble or water-dispersible metal corrosion inhibitor is selected from the group consisting of a water-soluble compound having at least two hydroxy groups which do not dissociate in an aqueous medium and a water-dispersible compound having at least two hydroxy groups which do not dissociate in an aqueous medium.

6. A method for removing a residue and a contaminant, the method comprising:
   removing the residue and the contaminant from a surface of a semiconductor substrate suitable for manufacturing a microelectronic device with the aqueous, nitrogen-free cleaning composition according to claim 1.

7. The method according to claim 6,
   wherein the surface of a semiconductor substrate comprises an electrically conductive layer, an electrically insulating dielectric layer and a barrier layer after chemical mechanical polishing.

8. The method according to claim 7,
wherein the electrically conductive layer comprises copper,
the electrically insulating dielectric layer comprises a low-k or ultra-low-k dielectric material and
the barrier layer comprises tantalum, tantalum nitride, titanium nitride or ruthenium.

9. The aqueous, nitrogen-free cleaning composition according to claim 2,
wherein a metal of the water-soluble or water-dispersible metal corrosion inhibitor is copper.

10. The aqueous, nitrogen-free cleaning composition according to claim 1, wherein the pH adjuster is present and wherein the pH adjuster is at least one of lithium hydroxide, sodium hydroxide, potassium hydroxide, rubidium hydroxide, cesium hydroxide, magnesium hydroxide, calcium hydroxide, strontium hydroxide, barium hydroxide or a nitrogen-free buffering system based on phosphates, borates or salts of organic carboxylic acids.

11. The aqueous, nitrogen-free cleaning composition according to claim 1, wherein the water-soluble or water-dispersible metal corrosion inhibitor having no nitrogen-containing functional groups is present and is at least one member selected from the group consisting of polyhydric alcohols, polyhydric phenols and carboxylic acids having at least two hydroxy groups.

12. The aqueous, nitrogen-free cleaning composition according to claim 1, wherein the least one functional additive is present and is selected from the group consisting of dyes, biocides and preservatives.

13. The aqueous, nitrogen-free cleaning composition according to claim 1, wherein the pH adjuster is present.

14. The aqueous, nitrogen-free cleaning composition according to claim 1, wherein the water-soluble or water-dispersible metal corrosion inhibitor having no nitrogen-containing functional groups, the functional additive and the pH adjuster are present.

* * * * *